United States Patent [19]
Piccone

[11] 3,973,144
[45] Aug. 3, 1976

[54] THYRISTOR TRIGGER CIRCUIT ENABLED BY THYRISTOR FORWARD VOLTAGE LEVEL

[75] Inventor: Dante E. Piccone, Glenmoore, Pa.

[73] Assignee: General Electric Company, Philadelphia, Pa.

[22] Filed: July 1, 1975

[21] Appl. No.: 592,302

[52] U.S. Cl. .................... 307/252 N; 307/252 Q; 307/305; 307/318; 321/27 R; 323/22 SC
[51] Int. Cl.² ........................................ H03K 17/72
[58] Field of Search ............... 307/252 N, 305, 318, 307/252 Q; 323/22 Z, 41, 36, 39, 22 SC; 321/27 R

[56] References Cited
UNITED STATES PATENTS 3,241,043  3/1966  Clarke .......................... 323/22 Z

*Primary Examiner*—John Zazworsky
*Attorney, Agent, or Firm*—J. Wesley Haubner

[57] ABSTRACT

A circuit for triggering a silicon controlled rectifier (SCR) when the voltage across the SCR has a predetermined polarity and exceeds a predetermined magnitude. The anode of a zener diode is connected to the SCR cathode and a resistor is connected between the SCR anode and the zener diode cathode. The voltage at the zener diode cathode acts as a bias for the trigger signal. A silicon unilateral switch responds to the biased trigger signal to trigger the SCR into the conductive state when the biased trigger signal level exceeds the switching voltage of the silicon unilateral switch.

8 Claims, 1 Drawing Figure

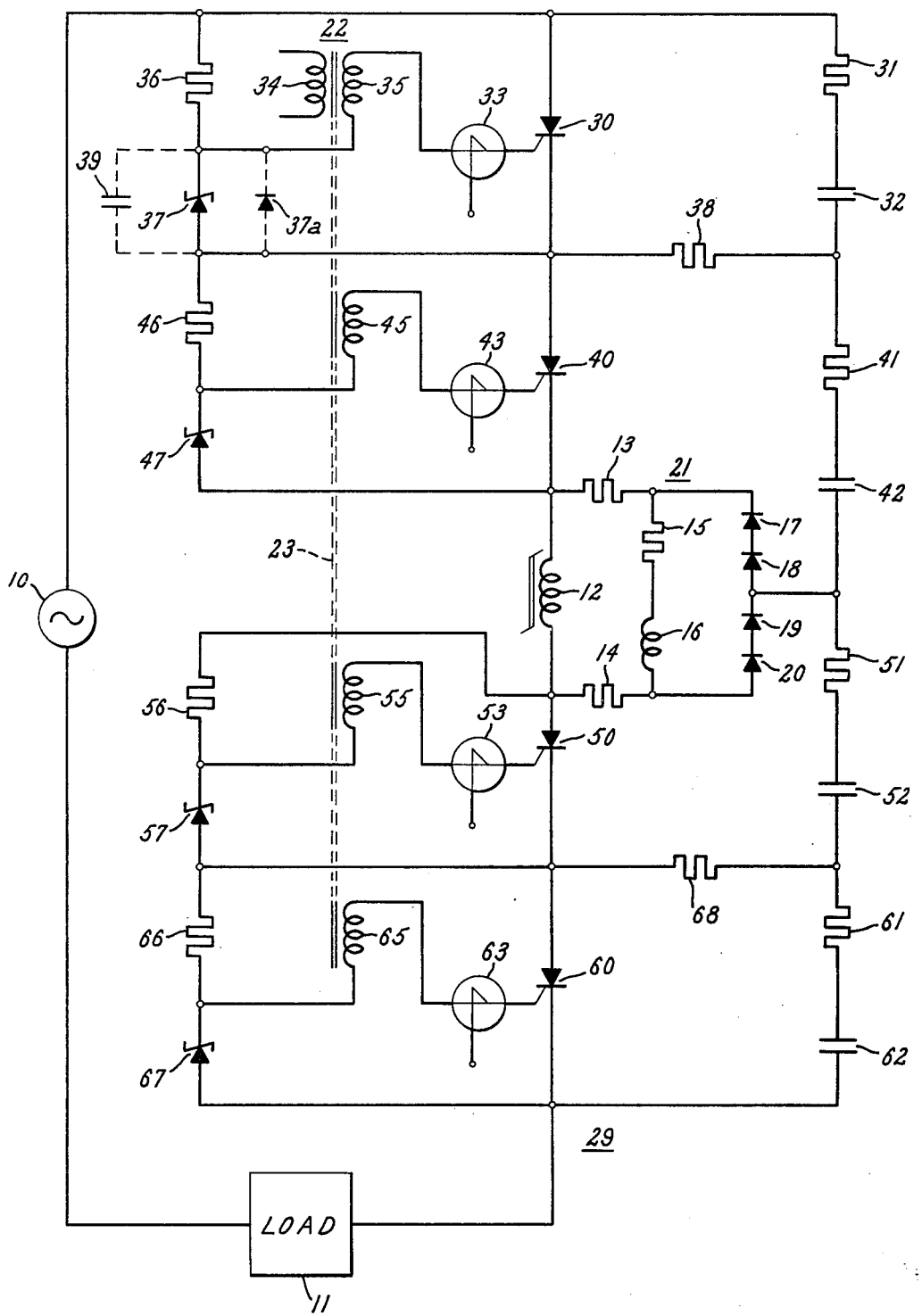

THYRISTOR TRIGGER CIRCUIT ENABLED BY THYRISTOR FORWARD VOLTAGE LEVEL

BACKGROUND OF THE INVENTION

The present invention relates to a trigger circuit for a thyristor and in particular to a circuit that will trigger a thyristor into conduction when the voltage appearing across the thyristor has a predetermined polarity and exceeds a predetermined magnitude.

It is common to use thyristors and in particular silicon controlled rectifiers (SCR's) to selectively connect a load to an a-c power source. The SCR can be switched from the non-conductive state to the conductive state by applying a trigger signal to the gate input when the SCR anode is more positive than the SCR cathode. In a prior art gate control circuit the SCR gate trigger signal is derived directly from the a-c power signal at the SCR anode. The gate trigger circuit is responsive to the voltage at the SCR anode and generates sufficient gate current to trigger the SCR into the conductive state once each cycle when the SCR anode voltage is positive with respect to the SCR cathode and exceeds a predetermined magnitude. Examples of such gate control circuits are illustrated and described at pages 91–94 of the SCR Manual Fifth Edition (1972), published by the General Electric Company.

In another prior art SCR gate trigger circuit as described in U.S. Pat. No. 3,793,537, Stringer, a separate trigger signal is combined with a signal representative of the polarity of the voltage across the SCR to generate a SCR gate trigger signal if the separate trigger signal occurs when the SCR anode voltage is more positive than the SCR cathode voltage. Stringer uses a differential amplifier for sensing the polarity of the voltage across the SCR and uses the differential amplifier output to enable the circuit which generates the SCR gate trigger signal.

Applicant has found that in certain applications it is desirable to enable the gate trigger circuit of the SCR based on both the polarity and the magnitude of the voltage appearing across the SCR. The reason for this is that on a short time basis SCR's may be generally considered to be charge control devices (see page 88 of the SCR Manual, supra). When a SCR gate trigger pulse is present long enough for the free charge in the SCR base region to reach a certain level and the SCR anode is positive with respect to the cathode, the SCR will be triggered into conduction. But if the SCR anode is not positive with respect to the SCR cathode during the occurrence of the SCR gate trigger pulse, it will take a short period of time for the free charge level in the SCR base region to be reduced to a level that will reliably maintain the SCR in the non-conductive state. The application of a forward voltage across the SCR before the free charge level in the SCR base region is significantly reduced is similar to firing the SCR with a weak gate signal which could result in triggering the SCR into conduction at an unwanted time, or may result in possible damage to the SCR. This condition could arise if the gate trigger signal for the SCR is not directly derived from the a-c power signal being switched by the SCR, or if the gate trigger signal is not synchronized or loses synchronization with the voltage appearing across the SCR.

It is, therefore, an object of this invention to provide a simple circuit for triggering a SCR into conduction when the forward voltage across the SCR has a desired polarity and exceeds a predetermined magnitude.

It is another object of this invention to switch a SCR to the conductive state upon the occurrence of a trigger signal when the forward voltage across the SCR is positive and exceeds a predetermined magnitude.

SUMMARY OF THE INVENTION

In accordance with my invention the anode of a zener diode is connected to the SCR cathode and a resistor is connected between the SCR anode and the zener diode cathode. The voltage at the zener diode cathode acts as a bias signal for the trigger signal. A silicon unilateral switch responds to the biased trigger signal to trigger the SCR into the conductive state when the biased trigger signal level exceeds the switching voltage of the silicon unilateral switch.

DESCRIPTION OF THE DRAWING

While the specification concludes with claims particularly pointing out and distinctly claiming that which is regarded as the present invention, the objects and advantages of this invention can be more readily ascertained from the following description of a preferred embodiment when read in conjunction with the accompanying drawing which is a schematic diagram of one embodiment of the invention.

DETAILED DESCRIPTION

The drawing illustrates one embodiment of the thyristor trigger circuit of this invention for controlling a plurality of SCR's in a "matrix" as described in U.S. Pat. No. 3,423,664, Dewey. As shown in the drawing, an a-c power source 10 is connected to a load 11 through a switching circuit matrix 29. The switching matrix 29 includes a plurality of series connected thyristor sections 30, 40, 50, 60. Although each thyristor section 30, 40, 50, 60 is shown as a single SCR it is understood that when large load currents are being controlled, each thyristor section can consist of a plurality of SCR devices connected in parallel. When working with very high voltage a-c power sources 10 it may be necessary to connect a plurality of matrices 29 in series between the a-c power source 10 and load 11. When a plurality of matrices 29 are employed between the a-c power source 10 and the load 11 each matrix 29 will also include a saturable core inductor 12 connected in series with the thyristor sections, as shown in the FIGURE. Connected in parallel with the saturable core inductor 12 is a voltage suppression circuit 21 consisting of resistors 13, 14, and 15, inductor 16, and diodes 17, 18, 19, and 20.

As shown in the drawing, thyristor section 30 is connected in parallel with the series combination of current limiting resistor 38 and a by-pass circuit consisting of resistor 31 and capacitor 32. Similarly, thyristor section 60 is connected in parallel with the series combination of current limiting resistor 68 and a by-pass circuit consisting of resistor 61 and capacitor 62. Thyristor 40 is connected in parallel with the series combination of current limiting resistor 38, a by-pass circuit consisting of resistor 41, and capacitor 42, and a portion of the voltage suppression circuit 21. Similarly, thyristor section 50 is connected in parallel with the series combination of current limiting resistor 68, a by-pass circuit consisting of resistor 51, and capacitor 52, and a portion of voltage suppression circuit 21.

The by-pass circuits insure steady state and transient voltage sharing among the respective thyristor sections of the matrix 29. Although the four thyristor sections 30, 40, 50, and 60 are triggered simultaneously, the thyristor sections may not turn on simultaneously because they may have different turn-on times. When a thyristor section has been triggered to the conductive state, the voltage stored on its respective by-pass capacitor will drive a current through the conducting thyristor section that exceeds the holding current of that thyristor section, thereby maintaining the thyristor section in the conductive state until all of the thyristor sections have become conductive. The by-pass circuit capacitors also limit the rate at which the voltage across each thyristor section can change when the thyristor section is in the non-conductive state. The by-pass circuit resistors 31, 41, 51, and 61 serve two purposes. At the end of a conducting interval of the matrix they dampen oscillations between the circuit inductance and the by-pass capacitors and thereby limit the anode voltage overshoot on the corresponding thyristor section. In addition, at the beginning of a conducting interval they limit the initial switching current contributed to each thyristor section by the discharge of the associated by-pass capacitor.

The current limiting resistors 38, 68 serve two purposes: (1) they limit the magnitude and rate of rise of current that is contributed by each by-pass circuit to the associated thyristor section when that section initially switches to its low resistance, forward conducting state; and (2) they limit the current that can initially flow from the a-c source 10 to the load 11 through thyristor sections 30 and 60 if both of these sections were to turn on in advance of thyristor sections 40 and 50.

The voltage suppression circuit 21 limits the voltage developed across saturable core inductor 12 when the matrix 29 is switched from the conductive to the non-conductive state. When the matrix 29 is switched from the conductive to the non-conductive state, the current flowing through the inductor 12 can flow through the circuit loop formed by the inductor 12, resistor 14, diodes 17, 18, 19, and 20 and resistor 13. The energy stored in the inductor is dissipated for the most part by the current flowing through resistors 13 and 14. A more detailed description of the operation of the saturable core inductor 12, the voltage suppression circuit 21, current limiting resistors 38, 68, and the by-pass networks is provided in the aforementioned Dewey patent.

The improved SCR triggering circuit of my invention will now be described. As shown in the FIGURE, an SCR trigger signal is applied to the primary winding 34 of a transformer 22. The transformer 22 has four secondary windings 35, 45, 55, and 65 all wound on the same core as indicated by dashed lines 23. A resistor 36 is connected between the anode of thyristor section 30 and the cathode of zener diode 37. The anode of zener diode 37 is connected to the cathode of thyristor section 30. In a similar fashion, the series combination of resistor 46 and zener diode 47 is connected in parallel with thyristor section 40; resistor 56 and zener diode 57 is connected in parallel with thyristor section 50; and resistor 66 and zener diode 67 is connected in parallel with thyristor section 60. The secondary winding 35 of transformer 22 is connected between the cathode of zener diode 37 and the anode of a silicon unilateral switch (SUS) 33. The cathode of the SUS is connected to the gate terminal of thyristor section 30. In a similar manner, the series combination of secondary winding 45 and SUS 43 is connected between the gate of thyristor section 40 and the cathode of zener diode 47, a secondary winding 55 and SUS 53 is connected between the gate of thyristor section 50 and the cathode of zener diode 57; and the secondary winding 65 and SUS 63 is connected between the gate of thyristor section 60 and the cathode of zener diode 67.

The characteristic of the SUS is such that when it is in the non-conductive state and the gate electrode is floating as shown in the drawing, the SUS will not become conductive until the anode voltage exceeds the cathode voltage by a predetermined amount, S, as determined by the characteristic of the SUS device. In a preferred embodiment of my gate trigger circuit, the amplitude, G, of the trigger signal appearing across the secondary winding 35 of transformer 22 is less than the voltage, S, required to make SUS 33 become conductive. Also in the preferred embodiment, the reverse voltage, Z, at which the zener diode 37 will break down is less than the voltage, S, but greater than the voltage (S-G). The voltage developed at the cathode of zener diode 37 acts as a bias signal for the signal appearing across the secondary winding 35 of transformer 22. When the cathode of the thyristor section 30 is more positive than the anode of the thyristor section 30, zener diode 37 will conduct in the forward direction and the voltage at the cathode of zener diode 37 will be very nearly equal to the voltage at the cathodes of thyristor section 30 and SUS 33. When the amplitude of the trigger signal appearing at the secondary winding 35 of transformer 22 is added to the voltage at the cathode of zener diode 37, the resulting biased trigger signal level is insufficient to cause SUS 33 to become conductive. When the voltage V, at the anode of the non-conductive thyristor section 30 is more positive than the voltage at the cathode of thyristor section 30, but is less than the voltage, Z, the zener diode 37 will be non-conductive and the voltage at the cathode of zener diode 37 will be essentially the voltage, V, appearing at the anode of the thyristor section 30. As soon as the sum of the voltages V + G exceeds S, SUS 33 will become conductive thereby allowing current to flow into the gate of thyristor section 30. The thyristor gate current flows through the circuit loop formed by the gate and cathode of thyristor section 30, through the forward direction of zener diode 37 through the secondary winding of transformer 22 and through the SUS 33.

Since the zener diode breakdown voltage Z is less than the voltage S required to make the SUS 33 become conductive, the voltage V is incapable of causing SUS 33 to become conductive in the absence of a trigger signal. It will be apparent to those skilled in the art that in certain applications the zener diode 37 can be replaced by an ordinary diode such as diode 37a, shown connected into the circuit with dashed lines. This latter embodiment might be used if the voltage V across the thyristor section 33 does not exceed S, or if resistor 36 is large so that the voltage appearing at the anode of thyristor section 30 is not able to provide enough current through SUS 33 to maintain the SUS in the conductive state. It will also be apparent to those skilled in the art that it may be necessary in certain applications to include a capacitor 39, shown connected into the circuit with dashed lines, in parallel with zener diode 37 to provide additional charge to guarantee that SUS 33 switches fully to the conductive state. It is clear from the preceding discussion that the thyristor section 30 cannot be triggered into conduction by the occurrence of a gate signal applied to the primary winding 34 of transformer 22 unless the voltage at the anode of thyristor section 30 is positive with respect to the voltage at the cathode of thyristor section 30 and unless the voltage exceeds the magnitude S-G. In a similar manner, the gate trigger circuits associated with thyristor sections 40, 50 and 60 will only switch its respective thyristor to the conductive state if the forward voltage of the thyristor is positive and exceeds the magnitude S-G.

While the present invention has been described with reference to a specific embodiment thereof it will be obvious to those skilled in the art that various changes and modifications may be made without departing from the invention in its broader aspects.

What is claimed as new and desired to be secured by Letters Patent of the United States is:

1. A circuit for triggering a thyristor into conduction comprising:
    a. first circuit means responsive to the voltage across the thyristor for generating a bias signal representative of the voltage across the thyristor;
    b. a transformer having a primary winding responsive to a trigger signal, and a secondary winding connected to the first circuit output for generating a biased trigger signal; and
    c. second circuit means responsive to the biased trigger signal for triggering the thyristor into conduction when the biased trigger signal level exceeds a predetermined value.
2. A circuit as recited in claim 1 wherein the thyristor is a silicon controlled rectifier (SCR).
3. A circuit as recited in claim 2 wherein the first circuit means comprises a resistor in series with a zener diode.
4. A circuit as recited in claim 2 wherein the first circuit means comprises a diode having its anode connected to the cathode of the SCR and having a resistor connected between the anode of the SCR and the cathode of the diode.
5. A circuit as recited in claim 4 wherein the diode is a zener diode.
6. A circuit as recited in claim 2 wherein the second circuit means is a silicon unilateral switch connected between the gate input of the SCR and the transformer secondary, the anode of the silicon unilateral switch being responsive to the biased trigger signal.
7. A circuit as recited in claim 5 wherein the second circuit means is a silicon unilateral switch connected between the gate input of the SCR and the transformer secondary, the anode of the silicon unilateral switch being responsive to the biased trigger signal.
8. A circuit as recited in claim 2 wherein the first circuit means additionally includes means for limiting the bias signal to a value less than said predetermined value.

* * * * *